(12) United States Patent
Hu

(10) Patent No.: US 10,379,656 B2
(45) Date of Patent: Aug. 13, 2019

(54) INPUT DEVICE

(71) Applicant: BOLYMEDIA HOLDINGS CO. LTD., Santa Clara, CA (US)

(72) Inventor: Xiaoping Hu, Shenzhen (CN)

(73) Assignee: BOLYMEDIA HOLDINGS CO. LTD., Santa Clara, CA (US)

( * ) Notice: Subject to any disclaimer, the term of this patent is extended or adjusted under 35 U.S.C. 154(b) by 0 days.

(21) Appl. No.: 15/778,200

(22) PCT Filed: Nov. 18, 2015

(86) PCT No.: PCT/CN2015/094900
§ 371 (c)(1),
(2) Date: May 22, 2018

(87) PCT Pub. No.: WO2017/084039
PCT Pub. Date: May 26, 2017

(65) Prior Publication Data
US 2018/0348940 A1    Dec. 6, 2018

(51) Int. Cl.
*G06F 3/041* (2006.01)
*G06F 3/02* (2006.01)
(Continued)

(52) U.S. Cl.
CPC .............. *G06F 3/0414* (2013.01); *G06F 3/02* (2013.01); *G06F 3/0304* (2013.01); *G06F 3/042* (2013.01)

(58) Field of Classification Search
CPC ...... G06F 3/0414; G06F 3/042; G06F 3/0304; G06F 3/02
See application file for complete search history.

(56) References Cited

U.S. PATENT DOCUMENTS

| 3,621,268 A | 11/1971 | Freidrich et al. |
| 5,351,106 A | 9/1994 | Lesko et al. |

FOREIGN PATENT DOCUMENTS

| CN | 101236467 A | 8/2008 |
| CN | 101299603 A | 11/2008 |

(Continued)

OTHER PUBLICATIONS

International Search Report for PCT/CN2015/094900, dated Jul. 1, 2016, and its English translation provided by WIPO.
(Continued)

*Primary Examiner* — Abhishek Sarma
(74) *Attorney, Agent, or Firm* — Ladas & Parry, LLP

(57) ABSTRACT

An input device, comprising at least one key position (110) and a control and readout circuit (120). Each key position (110) is provided with a light transmission window (111) and a photosensitive device (112) thereon, the light transmission window (111) being used for the incidence of an external light, and the photosensitive device (112) being provided on the light path behind the light transmission window (111), the status of the photosensitive device corresponding to the light intensity of the incident external light. The control and readout circuit (120) is used for resetting and scanning each photosensitive device (112), and outputting, according to the scanned status of each photosensitive device (112), a key signal indicating whether the corresponding light transmission window (111) is covered or not. The input device obtains input information by means of sensing the variation of the light intensity, instead of the traditional press input method, enabling, on one hand, a quicker reaction speed and on the other hand requiring no finger press, not only reducing the workload of the finger, but also decreasing the requirement for finger dexterity.

12 Claims, 3 Drawing Sheets

(51) Int. Cl.
*G06F 3/03* (2006.01)
*G06F 3/042* (2006.01)

(56) References Cited

FOREIGN PATENT DOCUMENTS

CN    102214002 A    10/2011
CN    203102166 U    7/2013

OTHER PUBLICATIONS

Written Opinion of the International Search Authority for PCT/CN2015/094900, dated Jul. 1, 2016, and its English translation from Bing.com Microsoft Translator.

INPUT DEVICE

CROSS REFERENCE TO RELATED APPLICATION

The present application is the U.S. national phase of PCT Application PCT/CN2015/094900 filed on Nov. 18, 2015, entitled "INPUT DEVICE", the disclosure of which is hereby incorporated by reference in its entirety.

TECHNICAL FIELD

The present disclosure relates to input apparatus, in particularly to an input apparatus that senses sensing a variation in light intensity.

PRIOR ART

With extensive use of electronic products, input apparatus as peripheral devices have become very common. Manual input is still a main input method at present.

Common input apparatus, such as keyboards, touch screens, buttons and the like, may input information basically based on pressure-induced state changes. Even optical mice usually employ pressure buttons as left and right buttons.

However there are some disadvantages such as unresponsiveness and finger fatigue in these pressure-based manual input methods.

SUMMARY OF THE INVENTION

An input apparatus according to the present disclosure may include at least one key position and a control and readout circuit. Each key position is provided with a light transmission window and a photosensitive device thereon. The light transmission window may be used for incidence of an external light. The photosensitive device may be disposed on a light path behind the light transmission window, and the status thereof may be corresponding to the light intensity of the incident external light. The control and readout circuit may be configured for resetting and scanning each photosensitive device, and outputting, according to the scanned status of each photosensitive device, a key signal indicating whether the corresponding light transmission window is covered or not.

According to the input apparatus of the present disclosure, input information may be obtained, instead of a traditional press input method, by means of sensing a variation in light intensity, enabling a quicker reaction on one hand and requiring no finger press on the other hand; thereby not only reducing finger workload, but also decreasing finger dexterity since the finger is only needed to be moved to a position where the light transmission window is covered.

Specific examples according to the present disclosure will be described in detail below with reference to accompanying drawings.

DETAILED DESCRIPTION

Figure 1:
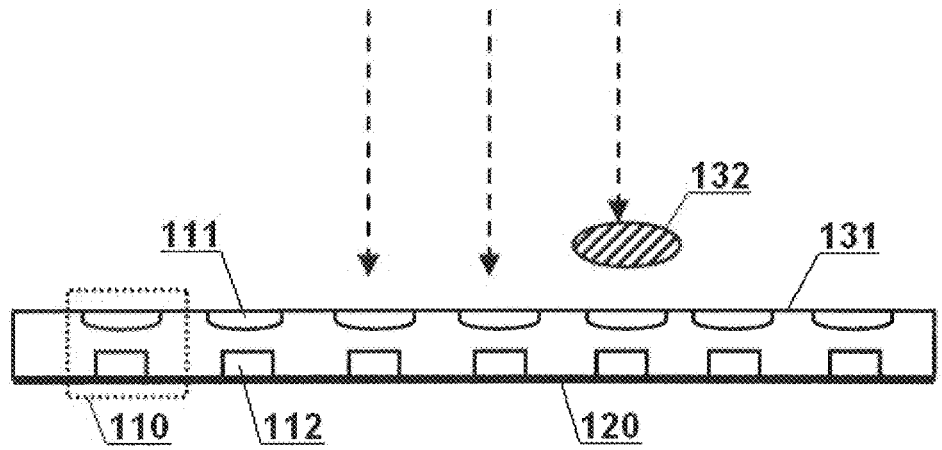
FIG. 1 is a schematically structural diagram of an input apparatus according to the present disclosure.

Refer to FIG. 1, a structure of an input apparatus according to the present disclosure may include a number of key positions 110 and a control and readout circuits 120.

Each key position 110 is provided with a light transmission window 111 and a photosensitive device 112.

The light transmission window 111 may be used for incidence of an external light (shown by dashed arrows in the figure) and can have any shape and arrangement. The light transmission windows at different key positions can be separated from each other or can be integrated as a whole, For example, the top of the entire input apparatus may be completely transparent, and a light-transmitting region corresponding to each key position can be regarded as the light transmission window of the key position. In some embodiments, the light transmission window may be an opening or a through hole on a mask 131 of the input apparatus. In other embodiments, the light transmission window may also be a window made of a transparent material and embedded on the mask, As a preferred embodiment, the light transmission window may include a condenser lens so that the incident external light can be better concentrated on the photosensitive device.

The photosensitive device 112 may be disposed on a light path behind the light transmission window, and the status of the photosensitive device may be corresponding to the light intensity of the incident external light. Various types of photosensitive devices may be suitable for use in the present disclosure as long as their detectable state can, according to different incident light intensity, generate corresponding changes. For example, photosensitive diodes, photosensitive resistance and the like may be selected. Depending on characteristics of different photosensitive devices, the status change thereof may be diverse, such as a variation in resistance value, or a variation in voltage value. As a preferred embodiment, a photovoltaic device, such as a silicon solar panel or a thin film solar cell, may be served as the photosensitive device, providing not only input function but also conversion and utilization of light energy.

The control and readout circuit 120 may be used for resetting and scanning each photosensitive device, and outputting, according to the scanned status of each photosensitive device, a key signal indicating whether the corresponding light transmission window is covered or not. The cover 132 may be, for example, a finger, a stylus, or the like, Since the light intensity shining on the photosensitive device is changed by blocking the external light, it is not necessary to arrange a light source on the apparatus. In order to accurately identify the status of the photosensitive device, the control and readout circuit may need to reset the photosensitive device prior to scanning the key position so as to eliminate the effect of accumulated light. The so-call reset means to restore the photosensitive device to a non-light-irradiated state. It can be cleared or reset, for example. Specific methods of clearing or resetting may vary for different photosensitive devices; for example, it can typically be implemented by applying a zero voltage or a reverse voltage to a readout end for a signal, A specific mode of clearing or resetting can be determined according to the characteristics of the photosensitive device used.

The scanning mode of the control and readout circuit is not limited in the present disclosure and can be realized by referring to the scanning modes employed in existing keyboards, touch screens or the like. For example, a periodic scanning mode or a triggered scanning mode may be adopted; and for another example, each key position may be scanned one by one at a predetermined time interval or all the key positions may be scanned at the same time during each scan.

A logic for determining the state of the key position, used in the control and readout circuit, may be designed based on actual utilization. For example, a threshold may be preset, and when a parameter of the photosensitive device which can be varied with light intensity (e.g. the resistance value of the photosensitive resistance, the voltage value of the photosensitive diode, etc.) is less than (or greater than) the preset threshold, the key position is reckoned to be covered, thereby generating one input. For another example, a threshold having a varied range may be set, and when a measured parameter of the photosensitive device is greater than the set threshold, the key position is reckoned to be covered, thereby generating one input. The varied range served as a criterion may be an absolute value, of the change (e.g. a difference value compared with a parameter value obtained from a previous scan), or a ratio of the change (e.g. a ratio compared with that measured in an uncovered condition, wherein the parameter value measured in an uncovered condition may be continuously updated). In some application, the latter is preferred in order to be able to accurately determine whether the state of the key position is covered or not when the ambient light intensity changes. Furthermore, it is also possible to employ a determining logic with which only the state of the key position changing from being uncovered to being covered is regarded as one input, and the one staying be covered or the one changing from being covered to being uncovered is not considered as one input. In this case, covering a key position for a long time may generate only a single input, and a second input may be produced by removing the cover and being covered again.

A way to output key signals employed in the control and readout circuit may be designed based on actual utilization. For example, it is possible to only output a key value of a key position in which the corresponding light transmission window is determined to be covered or uncovered; and it is also possible to output a signal indicating the status of all the key positions in a bitmap form. It should be noted that each key position represents a physical key; and similar to a traditional keyboard, a physical key may also be a composite key of a plurality of virtual keys and may be distinguished by a preset input rule (e.g. a combination of multiple keys), which will not be repeated herein.

By designing the size and arrangement of the key positions and an overall structure of the input apparatus according to the present disclosure, various input functions may be realized. In one embodiment, by means of designing the key positions as have the key size of a conventional keyboard and arranging the key positions with a preset rule, the input apparatus of the present disclosure may be formed as a keyboard. For easy identification, letters or symbols corresponding to the key positions may be printed or pasted at positions without disturbing the light transmission windows. In another embodiment, a key position having a size of millimeter level or less can be designed, the plurality of key positions may be arranged in a dense two-dimensional array and the top thereof is formed to be a flat body, resulting in forming the input apparatus according to the present disclosure as a sliding input tablet. Of course, different arrangements of the key position may also be integrated in one input device, for example, to form as a keyboard with a sliding input tablet.

Since it is no need to be pressed, all the key positions of the input apparatus according to the present disclosure can be formed as a whole. As shown in FIG. 1, for example, an integrated perforated plate may be used at the top, the locations of the light transmission windows are hollowed out or sealed with transparent elements, and an integral printed circuit board (PCB) or flexible circuit board (FPC), etc. can be employed at the bottom, thus integrated the photosensitive devices with the control and readout circuit. Such structure can easily have superior characteristics of being ultra-thin and waterproof and dustproof. In other embodiments, the key positions may also be separated from each other so as to have an appearance similar to that of an existing keyboard, and accordingly, the circuit board carrying the photosensitive devices may also be divided into a plurality of pieces.

In a preferred embodiment, the present disclosure may also be combined with existing pressure input devices; that is, providing a pressure-sensitive device on at least one key position. In such case, the control and readout circuit is further configured for outputting a key signal indicating that a corresponding pressure-sensitive device is triggered. The pressure-sensitive device used may be an elastic switch mechanism, a touch screen or the like. For example, a transparent window may be provided on a keycap of a conventional keyboard and a photosensitive device may be arranged in the keycap, at this point, a single key position may provide two input states of "being covered" and "being covered and pressed", doubling the expressiveness of the key position. For another example, an input apparatus according to the present disclosure, such as the aforementioned slicing input tablet, may be provided below a conventional touch screen (capable of transmitting light). In the case, the photosensitive device may respond when the finger only blocks light, and the touch screen may respond when the finger touches the screen, thus producing two different inputs at a single key position. Since such combined input structure has a richer expressiveness of input, a key has dual purpose. Therefore, in a limited space, by reusing the key positions and increasing the size of a single physical key position, it is possible to use input apparatus with more convenience and improved input efficiency The input apparatus according to the present disclosure may be integrated with or separated from an electronic product or other external units of an electronic product (e.g. a speaker or a microphone). Therefore, according to actual utilization, the input apparatus may be configured with various additional function modules which may be for example selected from one or more of the following modules:

a power supply module: it is used for powering other electricity consumption modules; and it can be an energy storage type power module, such as a rechargeable or non-rechargeable battery, a super capacitor, etc.; or can be a power converter for an external power supply circuit; or can be a photovoltaic panel (which may either serve as the photovoltaic panel of the photosensitive device, or an additional photovoltaic panel);

a communication module: it is used to communicate with electronic products, transmit key signals, etc.; and it can be a wired or wireless communication module, such as an infrared communication module, a public radio frequency band communication module, a Bluetooth module, a WiFi module, a WiMax module, a 2G/3G/4G/5G communication module, etc.; and it is worth mentioning that the communication module for long-distance wireless communication, such as 3G/4G, may not be necessary in applications like computer keyboards, but for hand-held cash register terminals, terminals of mobile customer service platform and other remote distributed devices, they are preferably used;

an additional input module: it may be one which uses other means to acquiring input information; for example, an image acquisition module for inputting a fingerprint or a palmprint, a voice recognition module for inputting a sound signal, etc.; the input information of these modules may be used in an alternated or coordinated manner with the input information of the photosensitive device;

a storage module: it is used for recording inputted historical data and generating input prompts for subsequent input according to the historical data, wherein such prompts can be displayed through other connected external devices such as a screen; and an interface module: it is used for connecting various external devices, and it may include a serial interface, a parallel interface, a USB interface, a memory card (such as SD card, TFT card) interface, an external speaker and microphone interface, a network cable interface and etc.

Specific forms of the input apparatus according to the present disclosure will be described below by way of examples.

First Embodiment

Figure 2:
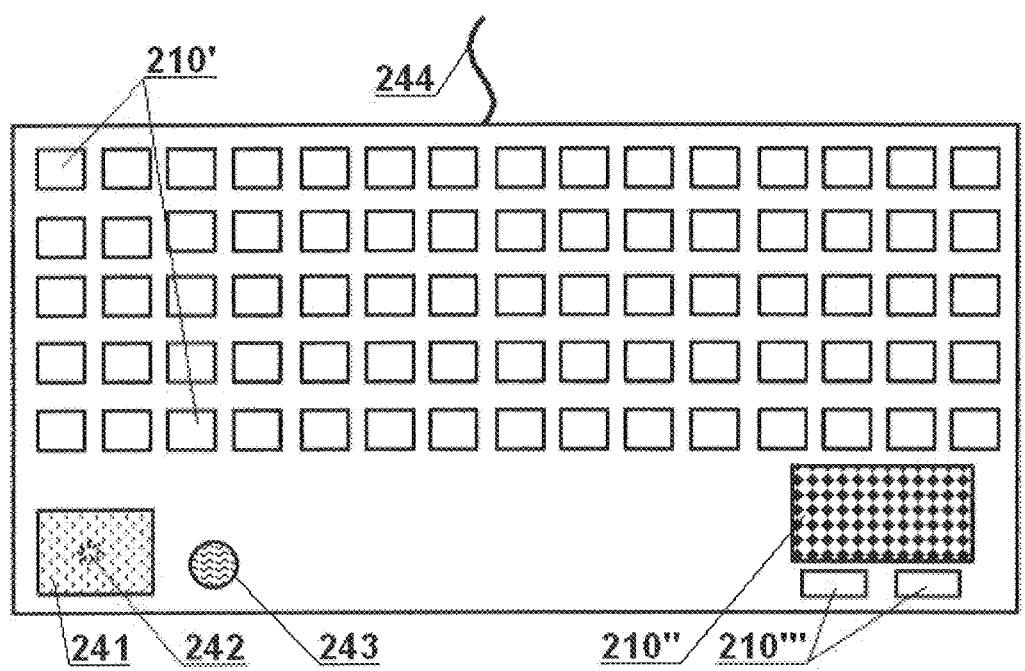
FIG. 2 is a schematic diagram of key position configuration of an input apparatus according to a first embodiment.

Referring to FIG. 2, an embodiment of an input apparatus according to the present disclosure is a multifunctional computer keyboard. An input apparatus may include a number of key positions and a control and readout circuit (not shown). Among them, the key positions using light input is divided into three groups: a first group consisting of a number of key positions 210', a second group consisting of a number of key positions 210" and a third group consisting of two key positions 210'''. Each key position 210' has a size similar to that of a key in a conventional keyboard and the arrangement of the key positions 210' is equivalent to that of the conventional keyboard, The size of every key position 210" is millimeter level or smaller, and the key positions 210" are arranged in a dense two-dimensional array, forming a sliding input tablet, implementing the function of a sliding mouse. The key positions 210''', each having a size equivalent to that a conventional key are arranged near the sliding input tablet, acting as the left and right buttons of a mouse.

The present embodiment may also be provided with additional modules as follows: an image acquisition module 241 (such as an area-array photosensitive device) for inputting a fingerprint; and a microphone 243 for voice input in cooperation with a voice recognition module (not shown); wherein the image acquisition module may employ a built-in LED light source 242 (arranged below the photosensitive device) as a light source for collecting fingerprints.

By means of using voice inputting and manual inputting, and selecting one of a plurality of key values corresponding to a single key signal according to the inputted voice signal, or selecting one of the currently possible multiple input results, the keyboard of the embodiment can greatly improve the convenience of input. For example, the uppercase and lowercase of a letter may be selected by using speech input (e.g. speech representing orientation, such as: up, down, left, right, etc.), or one of a plurality of virtual keys representing a physical key may be selected, or one of multiple homophone words presented may be selected, etc. From this, the convenience of speech input is taken advantage on one hand, and on the other hand, the lack of privacy of current speech input is also avoided since the speech itself is not input content.

The keyboard of this embodiment may be used to replace a conventional keyboard and mouse, and may be used in cooperation with various computers through a connection line 244 (for example, a USB connection cable), such as a desktop computer, a laptop computer, a tablet computer, and the like. Because the keyboard of the embodiment can be easily designed as an ultra-thin and sealed one, it can be separated from a computer and be used with different computers, which is not only convenient to carry but also reduces waste.

Since the keyboard usually has a large surface area, as a preferred embodiment, the photosensitive device provided on the optical input key position can employ a photovoltaic device, such as a photovoltaic panel, so as to act as a light energy converter when the keyboard is not in operation. The converted electrical energy can be stored in a battery inside the apparatus, or can be used by other external devices, such as charging the mobile phone. Accordingly, the control and readout circuit may be also used for switching the keyboard between a working state and an idle state; the resetting and scanning for the photovoltaic device is performed in the working state to obtain input information from a user; and the photovoltaic device is operated in a power mode in the idle state. The switching between the working and idle states can be performed automatically by the control and readout circuit. For example, when the status of all photosensitive devices stays unchanged after a set duration, the state is switched to be the idle state, and when the status of any one photosensitive device changes, the state is switched to be the working state; or the switch between the working state and the idle state can be performed in accordance with a switching signal generated by a set switch when the user triggers the set switch. Such two switching modes can be used cooperatively. Of course, if the photovoltaic device is not employed by the photosensitive device, the input apparatus can also be switched between the working and idle states, and at this point, it is switched to operate in a power saving, mode, not the power mode, in the idle state.

The input apparatus in this embodiment and subsequent embodiments may be provided with more additional function modules as described above according to actual requirements, which will not be described here.

Second Embodiment

Figure 3:
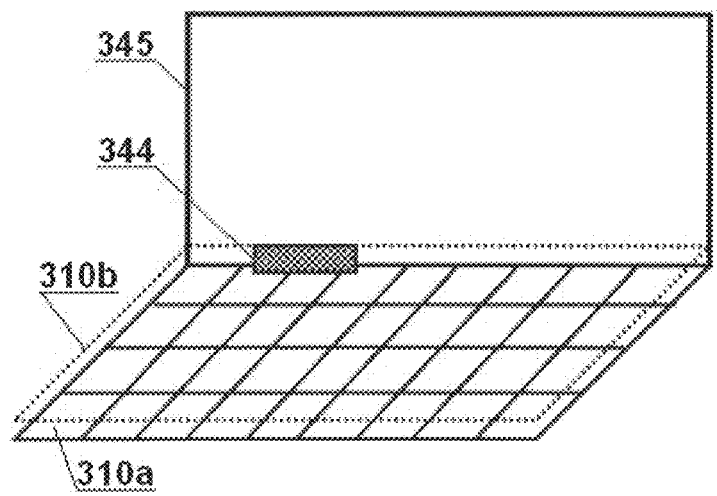
FIG. 3 is a schematically structural diagram of an input apparatus according to a second embodiment.

Referring to FIG. 3, another embodiment of an input apparatus according to the present disclosure is a multifunctional mobile phone protecting case. In this embodiment, the input apparatus is connected with a mobile phone 345 through a connecting port 344. The key position is a composite structure, the lower part thereof is light input key positions 310a, and the upper part thereof is a touch screen 310b. The photosensitive devices of all the light input key positions 310a are obtained by dividing a photovoltaic panel and arranged in the form of a keyboard. The photovoltaic panel is integrated with a control and readout circuit (not shown) on a circuit board.

Similar to the first embodiment, the photovoltaic panel on the light input key positions can be used for both input and power supply. Preferably, the back side of the input apparatus (the protecting case) may also be provided as a photovoltaic panel (not shown), so that when the protecting case is covered on the mobile phone, it can still be charged with light energy.

Third Embodiment

Figure 4:
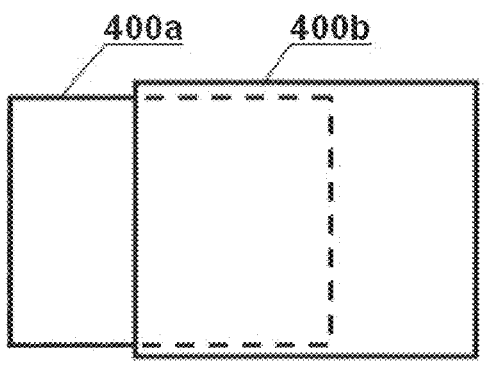
FIG. 4 is a schematic diagram of an overall shape of an input apparatus according to a third embodiment.

Referring to FIG. 4, another embodiment of an input apparatus according to the present disclosure is a retractable keyboard, In this embodiment, the keyboard is integrally formed with two relatively slidable portions 400a and 400b, so that the overall size of the keyboard can be greatly reduced during storage and the keyboard is more portable. Since the light input key positions used in the input apparatus according to the present disclosure are easily formed into an integral structure, it is very easy to divide the entire keyboard into two or more portions, and the separated parts can be communicated with each other via a wired or wireless (e.g. infrared) manner.

Figure 5:
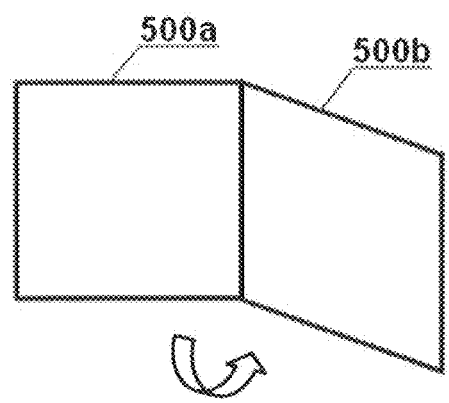
FIG. 5 is a schematic diagram of another overall shape of an input apparatus according to the present disclosure.

In other embodiments, the separated portions may also be pivotally connected, for example, as shown in FIG. 5, the two portions 500a and 500b that make up the keyboard may be folded together by rotation.

Fourth Embodiment

Figure 6:
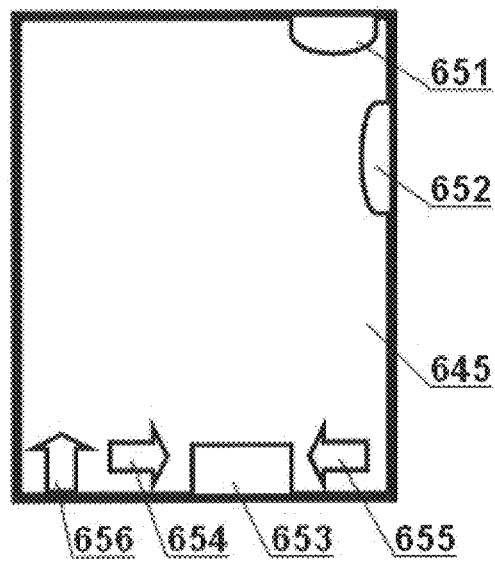
FIG. 6 is a schematic diagram of key position configuration of an input apparatus according to a fourth embodiment.

Referring to FIG. 6, another embodiment of an input apparatus according to the present disclosure is in conjunction with a mobile phone to serve as various input keys on the mobile phone.

In this embodiment, the input keys on the mobile phone 645 may include: an on-off key 651, a volume adjustment key 652, a main menu key 653, a forward key 654, a back key 655, and a sub-menu key 656. Each key can be made by using the structure of the light input key position according to the present disclosure, Alternatively, some of the keys, such as 653/654/655/656, may be integrated into the touch screen of the mobile phone.

By using the light input key position according to the present disclosure to make the input keys on the surface of the mobile phone, the mobile phone can be formed into a fully-enclosed structure (the light transmission window of the light input key position may be enclosed by a transparent material like transparent plastic, and charging devices and external computers, etc. can be used in a wireless way); thus providing a nice waterproof ability.

In other embodiments, the number of the input keys on the surface of the mobile phone may also be increased or decreased according to actual requirements, The structure of the light input key position according to the present disclosure is particularly advantageous for the on-off key and the volume adjustment key that are usually located on a side of the mobile phone.

Fifth Embodiment

Figure 7:
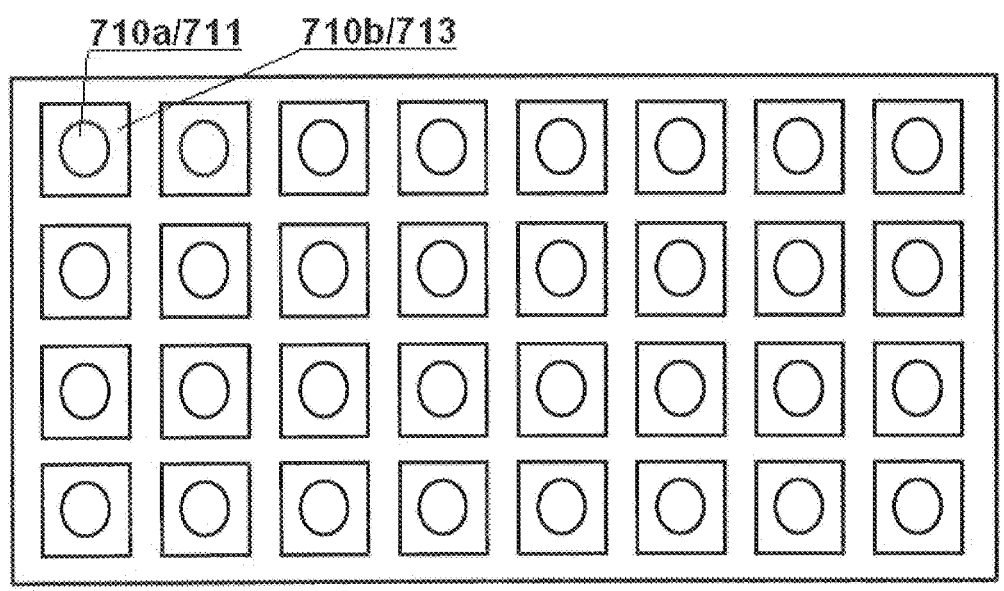
FIG. 7 is a schematic diagram of key position configuration of an input apparatus according to a fifth embodiment.

Referring, to FIG. 7, another embodiment of an input apparatus according to the present disclosure is a keyboard using a composite key position.

In this embodiment, the light input key position 710a is combined with the key position 710b of a conventional push-button keyboard to form a composite key position having a dual input state. Referring to FIG. 7, the light transmission window 711 of the light input key position 710a is arranged on the keycap 713 of the elastic key mechanism 713, and a corresponding photosensitive device (not shown) is arranged in the keycap. When the light transmission window 711 is only covered but not pressed down by a user's finger, only the phonesensitive device will respond, and when the keycap 713 is pressed, the elastic key mechanism will also respond, resulting in a key position having dual input states.

The keyboard in this embodiment is suitable for users who are accustomed to using traditional keyboards. In addition, since dual input states can be provided, the number of key positions can be reduced twofold, and it is also suitable for space-limited application scenarios.

The principle and implementation manners present disclosure has been described above with reference to specific embodiments, which are merely provided for the purpose of understanding the present disclosure and are not intended to limit the present disclosure. It will be possible for those skilled in the art to make variations based on the principle of the present disclosure.

The invention claimed is:

1. An input apparatus comprising:
at least one key position provided with a light transmission window and a photosensitive device thereon, the light transmission window being configured for incidence of an external light, the photosensitive device being disposed on a light path behind the light transmission window, and the status of the photosensitive device being corresponding to the light intensity of the incident external light; and
a control and readout circuit configured for resetting and scanning each photosensitive device, and outputting, according to the scanned status of each photosensitive device, a key signal indicating whether the corresponding light transmission window is covered or not;
wherein
at least one key position is provided with a pressure-sensitive device, and
the control and readout circuit is further configured for outputting a key signal indicating that a corresponding pressure sensitive device is triggered.

2. The apparatus according to claim 1, wherein
there are multiple key positions,
at least some of the key position are arranged according to a set rule so as to form a keyboard, or
at least some of the key positions are arranged in a dense two-dimensional array with a flat top so as to form a sliding input tablet.

3. The apparatus according to claim 1, wherein
the pressure-sensitive device is selected from a group consisting of an elastic switch mechanism and a touch screen.

4. The apparatus according to claim 1, wherein
the light transmission window comprises a condenser lens.

5. The apparatus according to claim 1, wherein
the photosensitive device is selected from a group consisting of photosensitive diodes, photosensitive resistance, and photovoltaic devices.

6. The apparatus according to claim 1, wherein
the control and readout circuit is further configured for switching the input apparatus between a working state and an idle state; the resetting and scanning for the photosensitive device is performed in the working state, and the photosensitive device is operated in a power saving mode in the idle state.

7. The apparatus according to claim 6, wherein
the photosensitive device is a photovoltaic device, and the photovoltaic device is configured for powering the input apparatus or an external apparatus.

8. The apparatus according to claim 7, wherein
the control and readout circuit is further configured for switching the input apparatus between a working state and an idle state; the resetting and scanning for the photosensitive device is performed in the working state, and the photosensitive device is operated in a power saving mode in the idle state.

9. The apparatus according to claim 6, wherein
the control and readout circuit is further configured for automatically switching between the working state and the idle state, when the status of all photosensitive devices stays unchanged after a set duration, the state is switched to be the idle state, and when the status of any one photosensitive device changes, the state is switched to be the working state; or
the control and readout circuit is further configured for performing switch between the working state and the idle state in accordance with a switching signal generated by a set switch which is triggered by a user.

10. The apparatus according to claim 1, further comprising
a speech recognition module configured for inputting a sound signal, the sound signal being used for selecting one of a plurality of key values corresponding to a single key signal, or for selecting one of a plurality of input results that are currently possible.

11. The apparatus according to claim 1, wherein
the apparatus is integrally formed as at least two portions, the at least two portions are connected in a sliding or pivoting manner.

12. The apparatus according to claim 8, wherein
the control and readout circuit is further configured for automatically switching between the working state and the idle state, when the status of all photosensitive devices stays unchanged after a set duration, the state is switched to be the idle state, and when the status of any one photosensitive device changes, the state is switched to be the working state; or
the control and readout circuit is further configured for performing switch between the working state and the idle state in accordance with a switching signal generated by a set switch which is triggered by a user.

* * * * *